United States Patent
Tsutsui et al.

(10) Patent No.: US 12,402,352 B2
(45) Date of Patent: Aug. 26, 2025

(54) UNIPOLAR-FET IMPLEMENTATION IN STACKED-FET CMOS

(71) Applicant: INTERNATIONAL BUSINESS MACHINES CORPORATION, Armonk, NY (US)

(72) Inventors: Gen Tsutsui, Albany County, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 17/643,014

(22) Filed: Dec. 7, 2021

(65) Prior Publication Data

US 2023/0178624 A1    Jun. 8, 2023

(51) Int. Cl.
| | | |
|---|---|---|
| *H10D 62/10* | (2025.01) | |
| *H10D 30/67* | (2025.01) | |
| *H10D 84/01* | (2025.01) | |
| *H10D 84/03* | (2025.01) | |
| *H10D 84/85* | (2025.01) | |

(52) U.S. Cl.
CPC ..... *H10D 30/6735* (2025.01); *H10D 30/6757* (2025.01); *H10D 62/118* (2025.01); *H10D 84/0167* (2025.01); *H10D 84/038* (2025.01); *H10D 84/85* (2025.01)

(58) Field of Classification Search
CPC ........... H10D 30/6735; H10D 30/6757; H10D 62/118; H10D 84/0167; H10D 84/038; H10D 84/85; H10D 30/014; H10D 30/43; H10D 62/121; H10D 88/00; H10D 88/01; B82Y 10/00
See application file for complete search history.

(56) References Cited

U.S. PATENT DOCUMENTS

| | | |
|---|---|---|
| 10,074,575 B1 | 9/2018 | Guillorn |
| 10,312,337 B2 | 6/2019 | Balakrishnan |
| 10,319,813 B2 | 6/2019 | Bi |

(Continued)

FOREIGN PATENT DOCUMENTS

| | | |
|---|---|---|
| CN | 101894842 A | 11/2010 |
| CN | 101958327 A | 1/2011 |

(Continued)

OTHER PUBLICATIONS

Notification of Transmittal of The International Search Report and the Written Opinion of the International Searching Authority, or the Declaration. International Application No. PCT/CN2022/134559. Mailed Jan. 29, 2023. 9pgs.

*Primary Examiner* — Elias Ullah
(74) *Attorney, Agent, or Firm* — Yuanmin Cai

(57) ABSTRACT

Embodiments are disclosed for a system. The system includes a semiconductor structure. The semiconductor structure includes a stacked field effect transistor (stacked-FET). The stacked-FET includes a top FET having multiple top channels having multiple nano-sheets in contact with corresponding nano-sheets in a corresponding top channels for an active gate. The stacked-FET includes multiple bottom channels having a dielectric material. The semiconductor structure also includes an active gate. The active gate includes the corresponding top channels and corresponding bottom channels having the dielectric material.

11 Claims, 18 Drawing Sheets

(56) References Cited

U.S. PATENT DOCUMENTS

| | | |
|---|---|---|
| 10,319,846 B1 | 6/2019 | Ando |
| 10,381,438 B2 | 8/2019 | Zhang |
| 10,388,569 B1 | 8/2019 | Cheng |
| 10,483,166 B1 | 11/2019 | Cheng |
| 10,741,456 B2 | 8/2020 | Cheng |
| 10,833,168 B2 | 11/2020 | Seo |
| 2010/0295021 A1 | 11/2010 | Chang |
| 2017/0110541 A1 | 4/2017 | Xu |
| 2017/0365604 A1 | 12/2017 | Suh |
| 2020/0105889 A1 | 4/2020 | Liaw |
| 2020/0119015 A1 | 4/2020 | Bi |
| 2021/0175128 A1 | 6/2021 | Gardner |
| 2021/0242351 A1* | 8/2021 | Gardner ................ H10D 88/01 |
| 2021/0272624 A1 | 9/2021 | Gomes |

FOREIGN PATENT DOCUMENTS

| | | |
|---|---|---|
| CN | 107527911 A | 12/2017 |
| CN | 110957316 A | 4/2020 |
| CN | 113345900 A | 9/2021 |

\* cited by examiner

UNIPOLAR-FET IMPLEMENTATION IN STACKED-FET CMOS

BACKGROUND

The present disclosure relates to single-field effect transistor (FET) implementation, and more specifically, to unipolar-FET implementation in stacked-FET complementary metal-oxide-semiconductor (CMOS).

Integrated circuits, such as microprocessors, may have a relatively large number of circuit elements, such as transistors in a limited chip area. The transistors can be n-type metal-oxide semiconductor field-effect transistors (nFET) or p-type metal-oxide semiconductor FET (pFET) type devices wherein the "N" and "P" designation depends on the type of dopants used in creating the source/drain regions of the devices. Complementary metal oxide semiconductor (CMOS) technology refers to integrated circuit products that use both NMOS and PMOS transistor devices.

SUMMARY

Embodiments are disclosed for a system. The system includes a semiconductor structure. The semiconductor structure includes a stacked field effect transistor (stacked-FET). The stacked-FET includes a top FET having multiple top channels having multiple nano-sheets in contact with corresponding nano-sheets in a corresponding top channel for an active gate. The stacked-FET includes multiple bottom channels having a dielectric material. The semiconductor structure also includes an active gate. The active gate includes the corresponding top channels and corresponding bottom channels having the dielectric material.

Embodiments are additionally disclosed for a method to fabricate an active gate of a unipolar stacked-FET complementary metal oxide semiconductor (CMOS). The method includes posting inner space formation to generate pillars on a substrate for the active gate. The method further includes performing a first ILD deposition on the substrate and around the pillars. The method also includes performing a liner deposition on the first ILD deposition and the pillars. Additionally, the method includes removing a region of the liner deposition. The region includes a single FET region. Further, the method includes performing an ILD removal. Also, the method includes performing a source/drain (S/D) epitaxy formation on the substrate and around a portion of the pillars.

Further aspects of the present disclosure are directed toward computer program products with functionality similar to the functionality discussed above regarding the computer-implemented method. The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
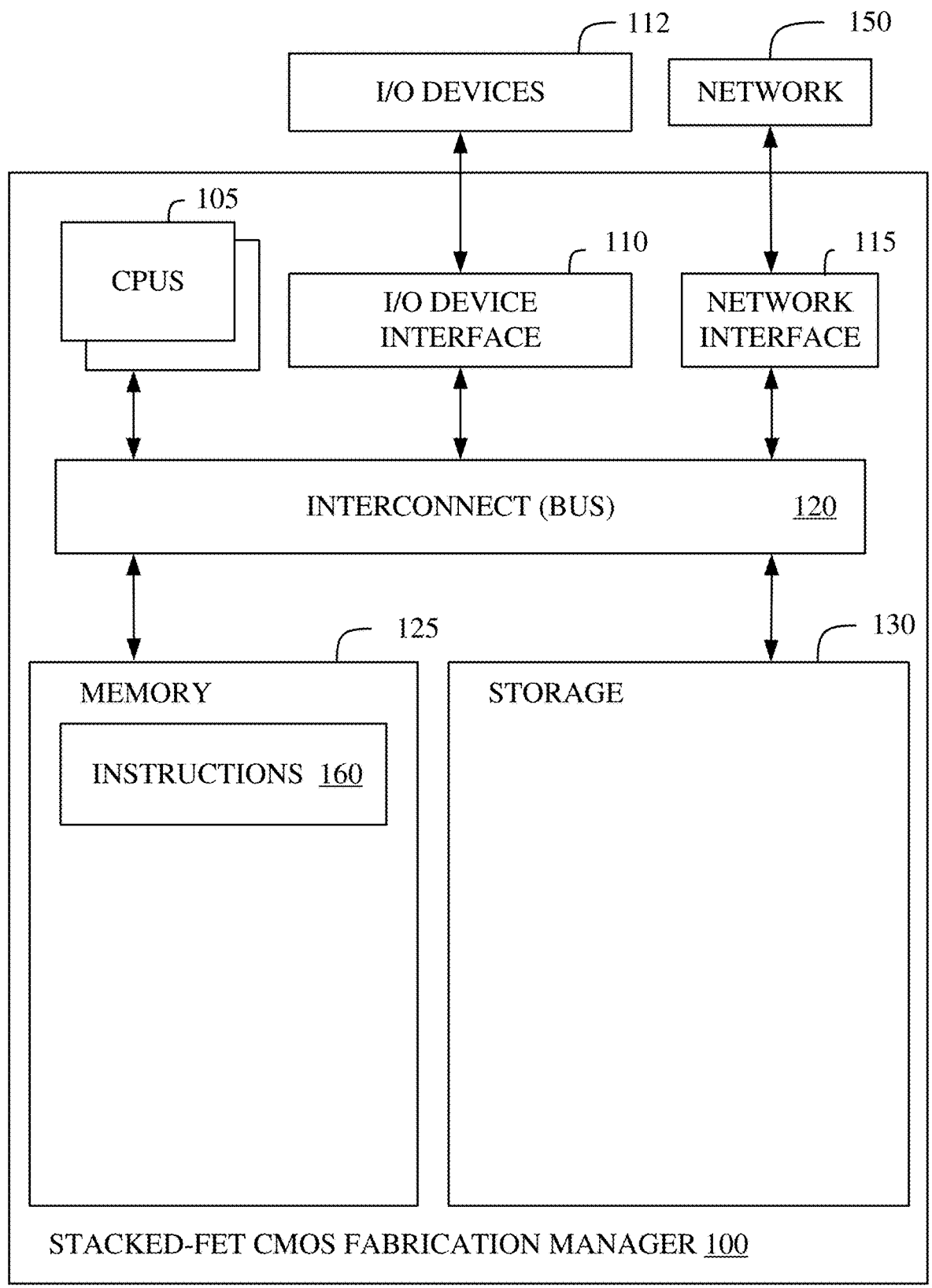
FIG. 1 is a block diagram of an example stacked field effect transistor (FET) complementary metal oxide semiconductor (CMOS) fabrication manager, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

As stated previously, CMOS technology refers to integrated circuit products that use both n-type and p-type transistor devices (e.g., nFET and pFET, respectively). However, irrespective of the physical configuration of the transistor device, each transistor device includes laterally spaced apart drain and source regions in a semiconductor substrate; a gate electrode structure positioned above the substrate and between the source/drain regions; and a gate insulation layer positioned between the gate electrode and the substrate. Accordingly, upon application of an appropriate control voltage to the gate electrode, a conductive channel region forms between the drain region and the source region and current flows from the source region to the drain region.

Further, a semiconductor device on a wafer may include multiple CMOSs, each of which may include stacked-FETs, where a pFET and nFET may be electrically connected, and disposed in a vertical arrangement with respect to the other. However, having a unipolar-FET implementation may provide some advantages in designing the semiconductor device. While it is possible to implement a unipolar-FET in a CMOS in a stacked-FET by disconnecting either the bottom or the top FET, this approach may introduce some challenges. For example, if the bottom FET is grounded, disconnecting the bottom FET can cause parasitic capacitance from gate to bottom-FET source-drain (S/D). Further, the parasitic capacitance can increase circuit delay, which decreases the efficiency of the CMOS. However, if the bottom FET is floating, disconnecting the bottom FET can create possible capacitive coupling from the top transistor to the bottom transistor, which can cause circuit failure.

Accordingly, some embodiments of the present disclosure can include a CMOS with unipolar-FETs that efficiently store and/or process data with reduced failure risk, and without increasing circuit delay. Additionally, in some embodiments of the present disclosure, the stacked-FET can include top and bottom FETs of the same type. Accordingly, such embodiments may be useful for configuring more dynamic CMOS designs. In this way, some embodiments of the present disclosure may improve the operation and efficiency of semiconductor devices having single and/or stacked-FET implementations.

FIG. 1 is a block diagram of an example stacked-FET CMOS fabrication manager 100, in accordance with some embodiments of the present disclosure. In various embodiments, the example stacked-FET CMOS fabrication manager 100 can perform the methods described in FIGS. 4 and 6, and/or the functionality discussed in FIGS. 2, 3, 5A-5J, and 7A-7C. In some embodiments, the example stacked-FET CMOS fabrication manager 100 provides instructions for the aforementioned methods and/or functionalities to a client machine such that the client machine executes the method, or a portion of the method, based on the instructions provided by the example stacked-FET CMOS fabrication manager 100. In some embodiments, the example stacked-FET CMOS fabrication manager 100 comprises software executing on hardware incorporated into a plurality of devices.

The example stacked-FET CMOS fabrication manager 100 includes a memory 125, storage 130, an interconnect (e.g., BUS) 120, one or more CPUs 105 (also referred to as processors 105 herein), an I/O device interface 110, I/O devices 112, and a network interface 115.

Each CPU 105 retrieves and executes programming instructions stored in the memory 125 or the storage 130. The interconnect 120 is used to move data, such as programming instructions, between the CPUs 105, I/O device interface 110, storage 130, network interface 115, and memory 125. The interconnect 120 can be implemented using one or more busses. The CPUs 105 can be a single CPU, multiple CPUs, or a single CPU having multiple processing cores in various embodiments. In some embodiments, a CPU 105 can be a digital signal processor (DSP). In some embodiments, CPU 105 includes one or more 3D integrated circuits (3DICs) (e.g., 3D wafer-level packaging (3DWLP), 3D interposer based integration, 3D stacked integrated circuits (3D-SICs), monolithic 3D integrated circuits, 3D heterogeneous integration, 3D system in package (3DSiP), and/or package on package (PoP) CPU configurations). Memory 125 is generally included to be representative of a random access memory (e.g., static random access memory (SRAM), dynamic random access memory (DRAM), or Flash). The storage 130 is generally included to be representative of a non-volatile memory, such as a hard disk drive, solid state device (SSD), removable memory cards, optical storage, and/or flash memory devices. Additionally, the storage 130 can include storage area-network (SAN) devices, the cloud, or other devices connected to the example stacked-FET CMOS fabrication manager 100 via the I/O device interface 110 or to a network 150 via the network interface 115.

In some embodiments, the memory 125 stores instructions 160. However, in various embodiments, the instructions 160 are stored partially in memory 125 and partially in storage 130, or they are stored entirely in memory 125 or entirely in storage 130, or they are accessed over a network 150 via the network interface 115.

Figure 3:
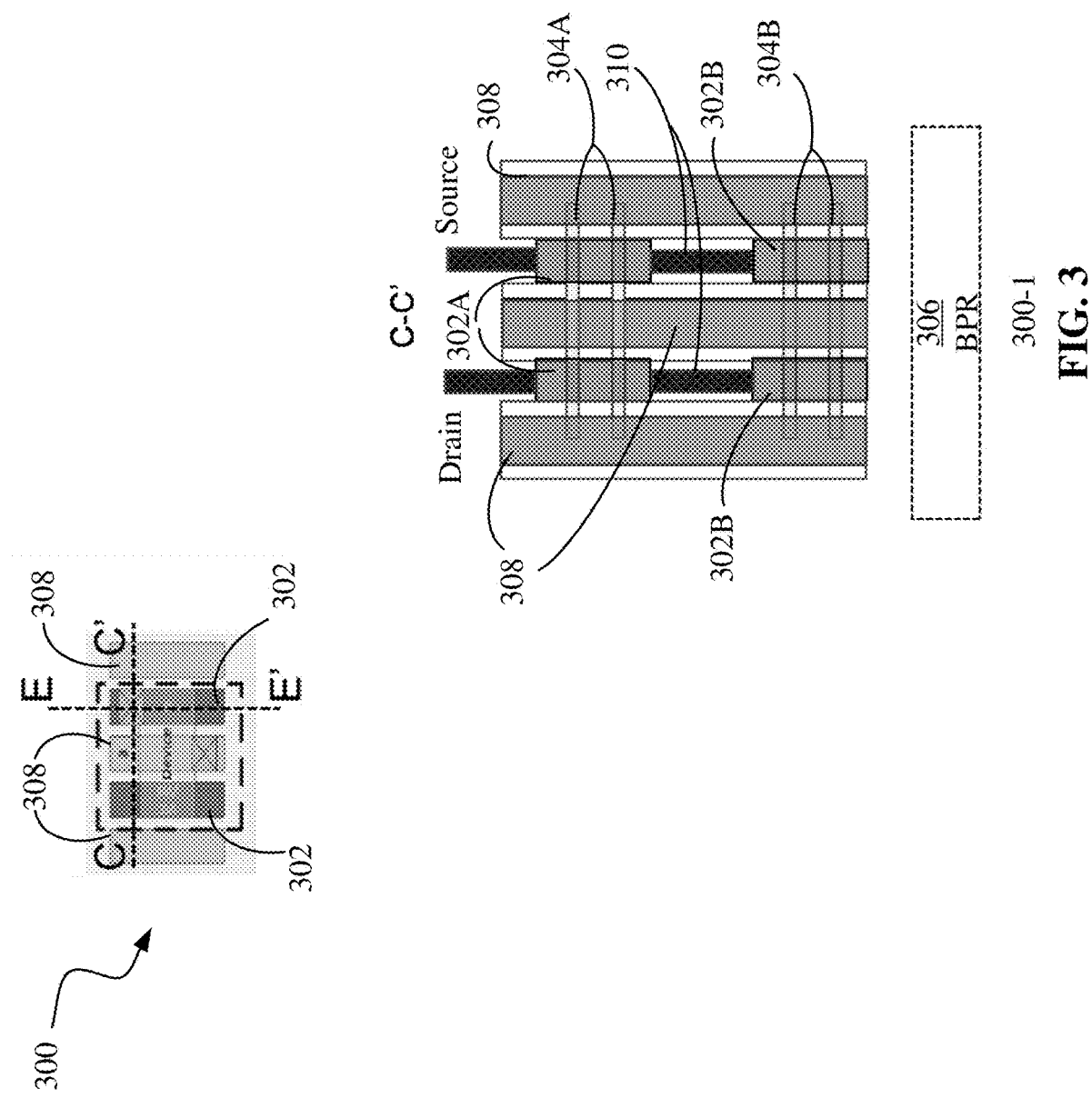
FIG. 3 is a block diagram of the top view of an example stacked-FET CMOS device having unipolar-FET implementation and side views of example stacked-FET CMOS devices, in accordance with some embodiments of the present disclosure.
Figure 4:
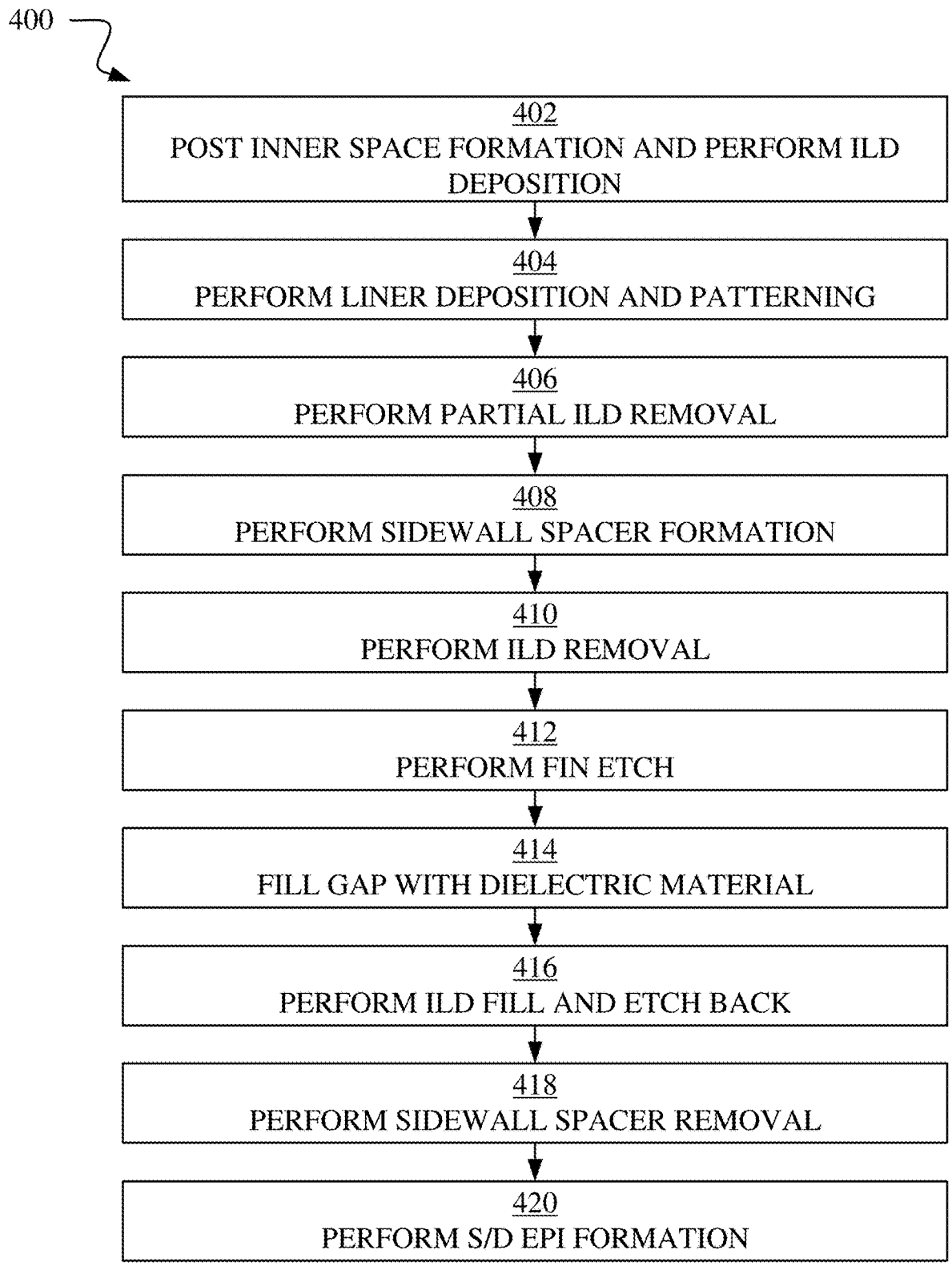
FIG. 4 is a process flow chart of a method for fabricating active gates for unipolar stacked-FET CMOS devices, in accordance with some embodiments of the present disclosure.
Figure 5A:
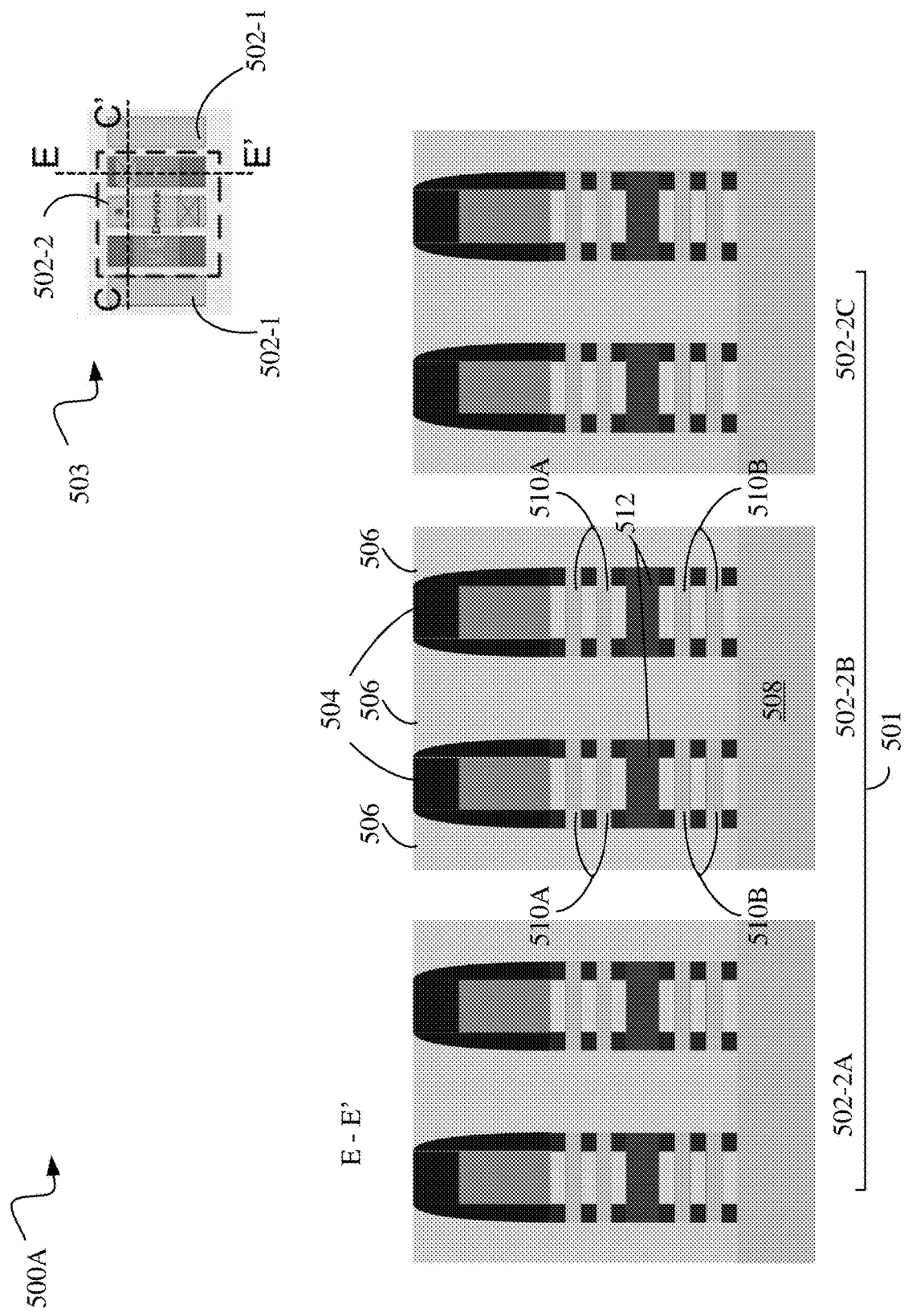
FIGS. 5A, 5B, 5C, 5D, 5E, 5F, 5G, 5H, 5I, and 5J are block diagrams of example fabrication states of a wafer having multiple stacked-FET CMOS devices, in accordance with some embodiments of the present disclosure.
Figure 5B:
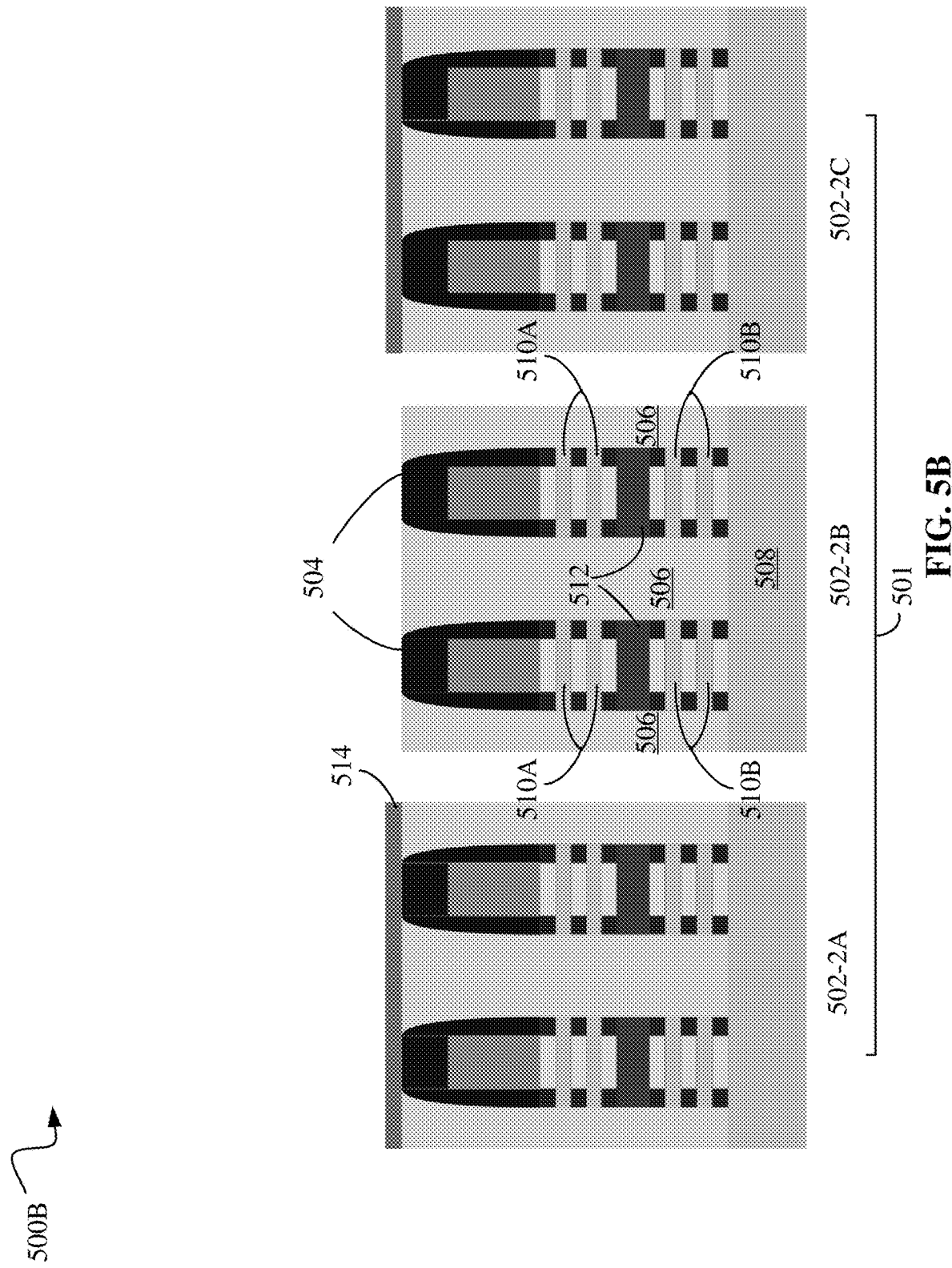
Figure 5C:
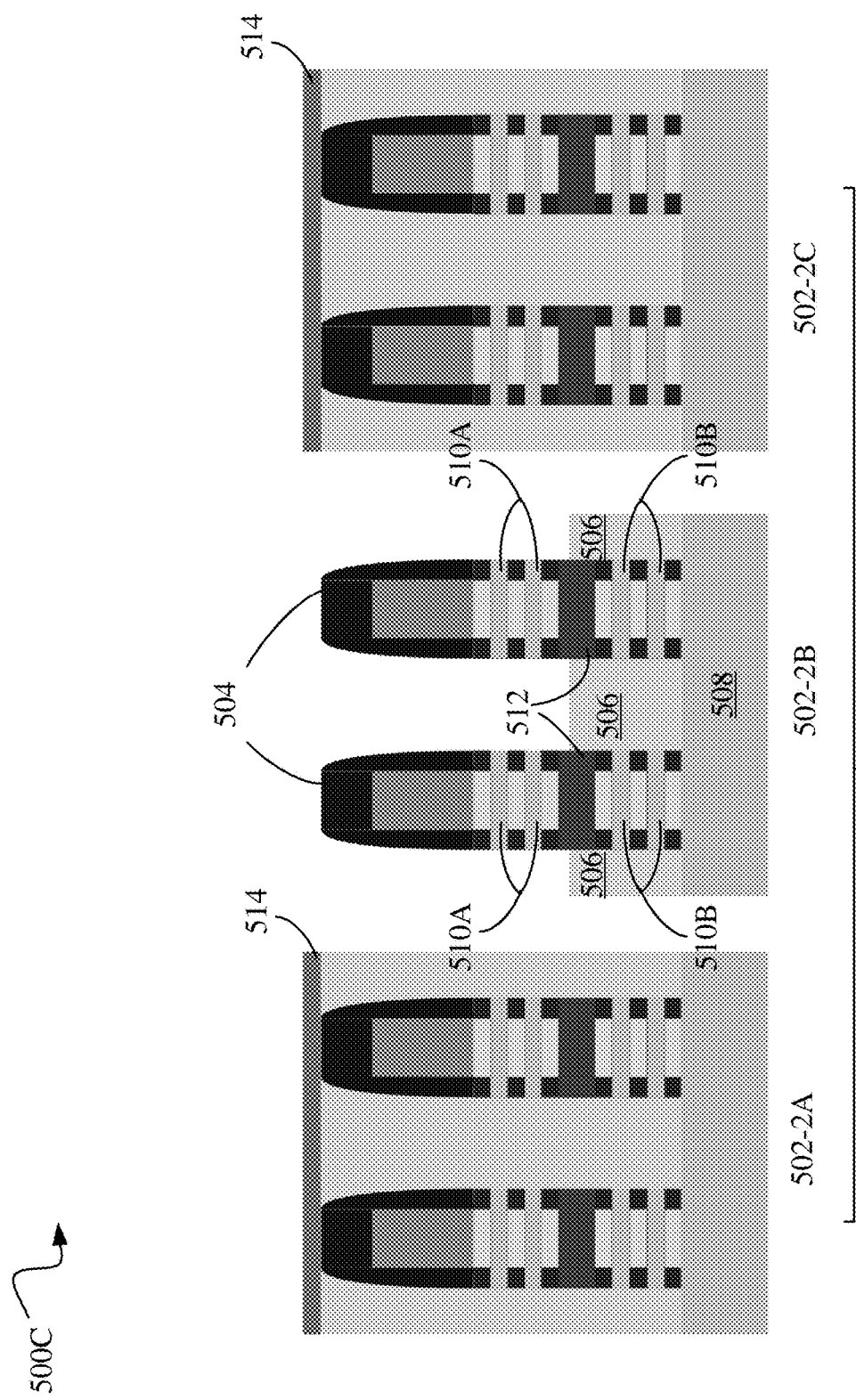
Figure 5D:
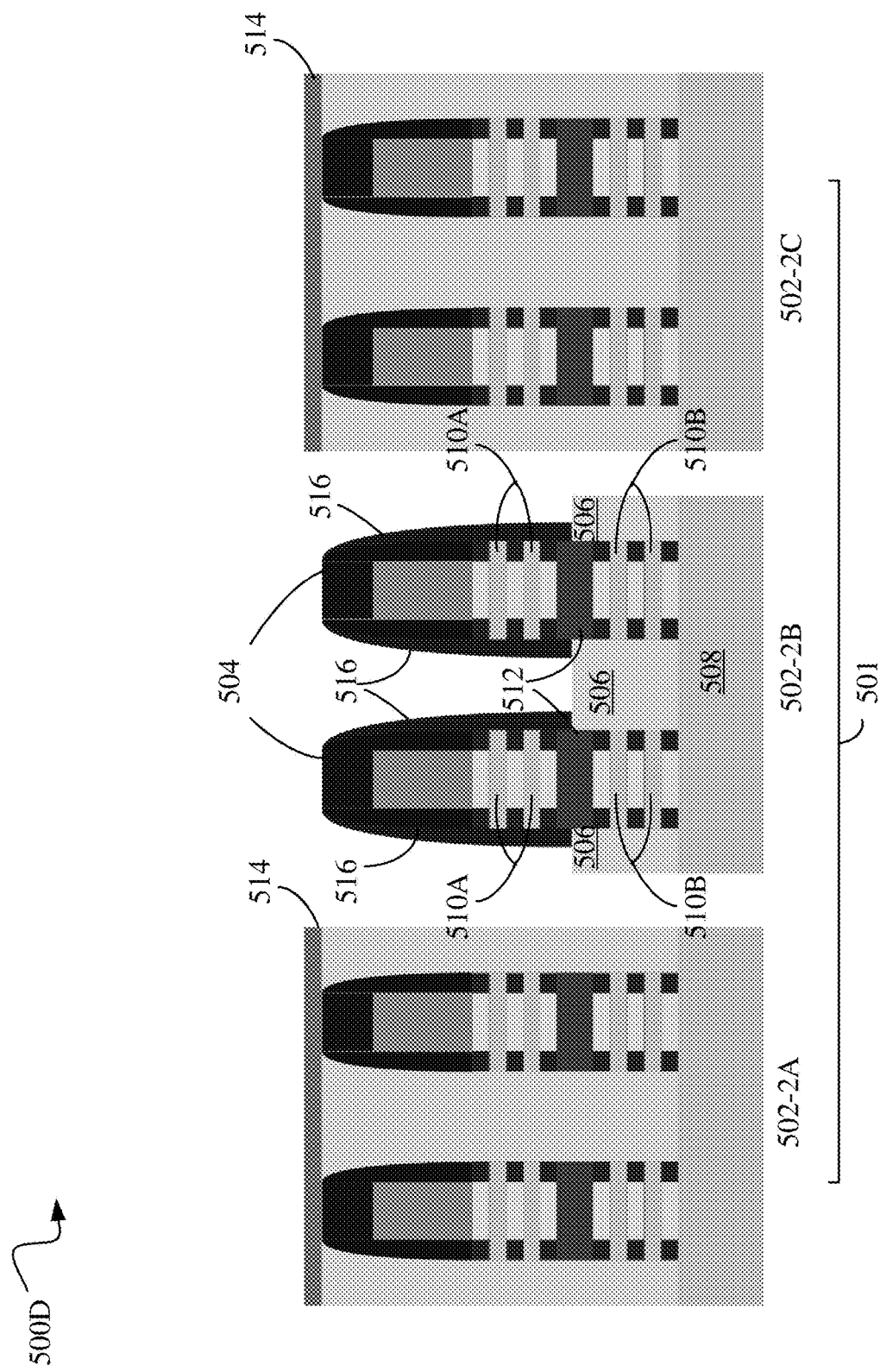
Figure 5E:
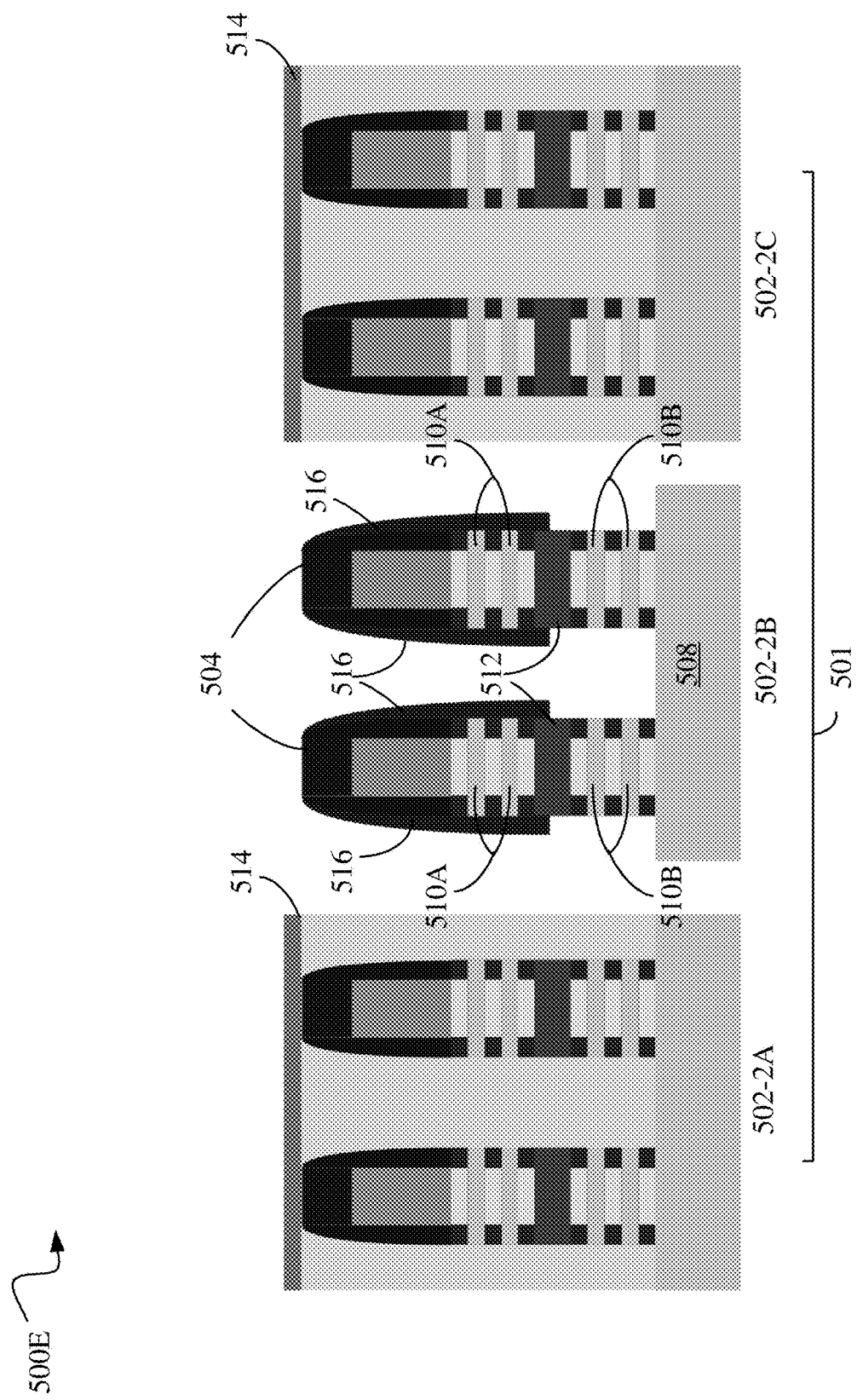
Figure 5F:
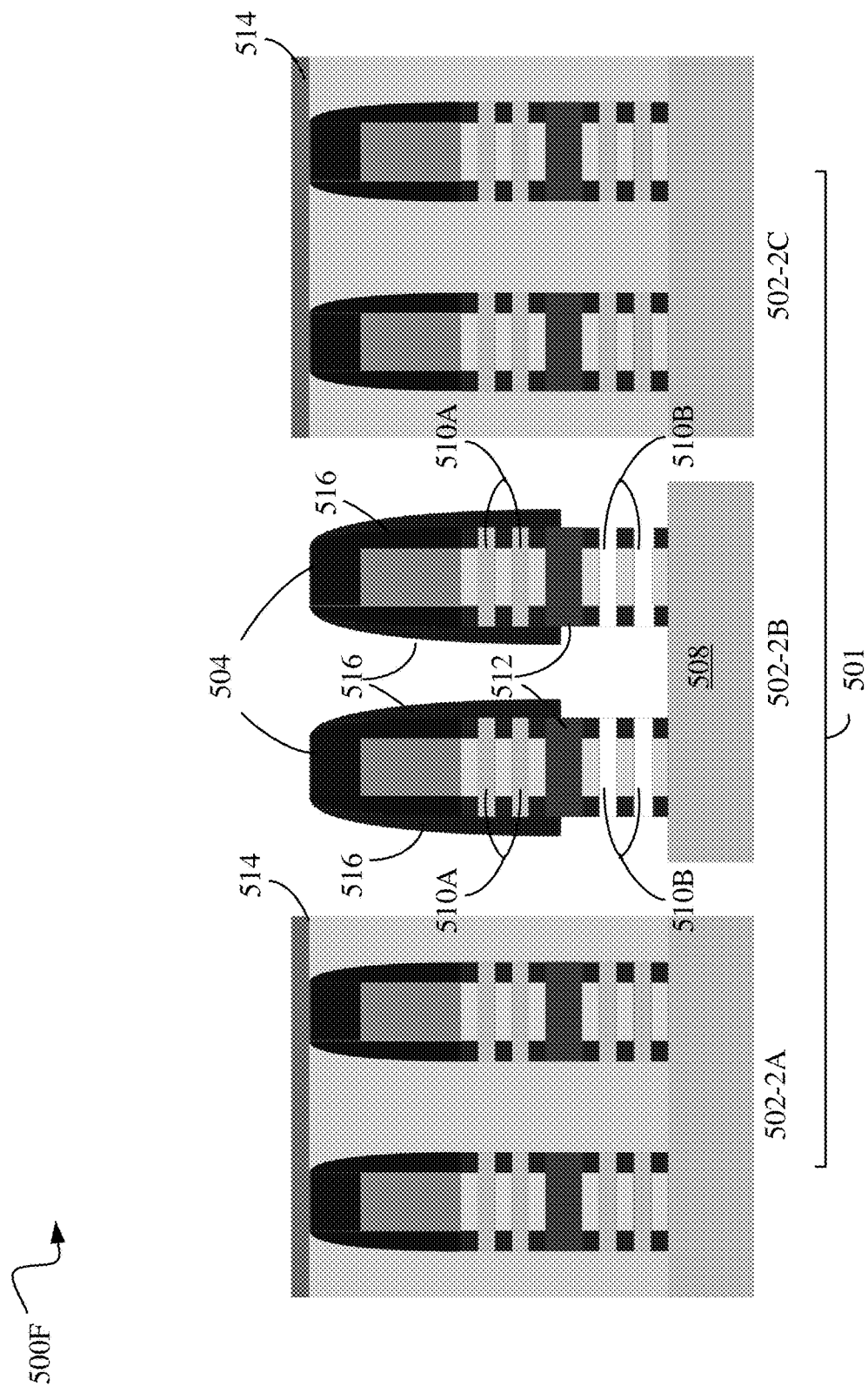
Figure 5G:
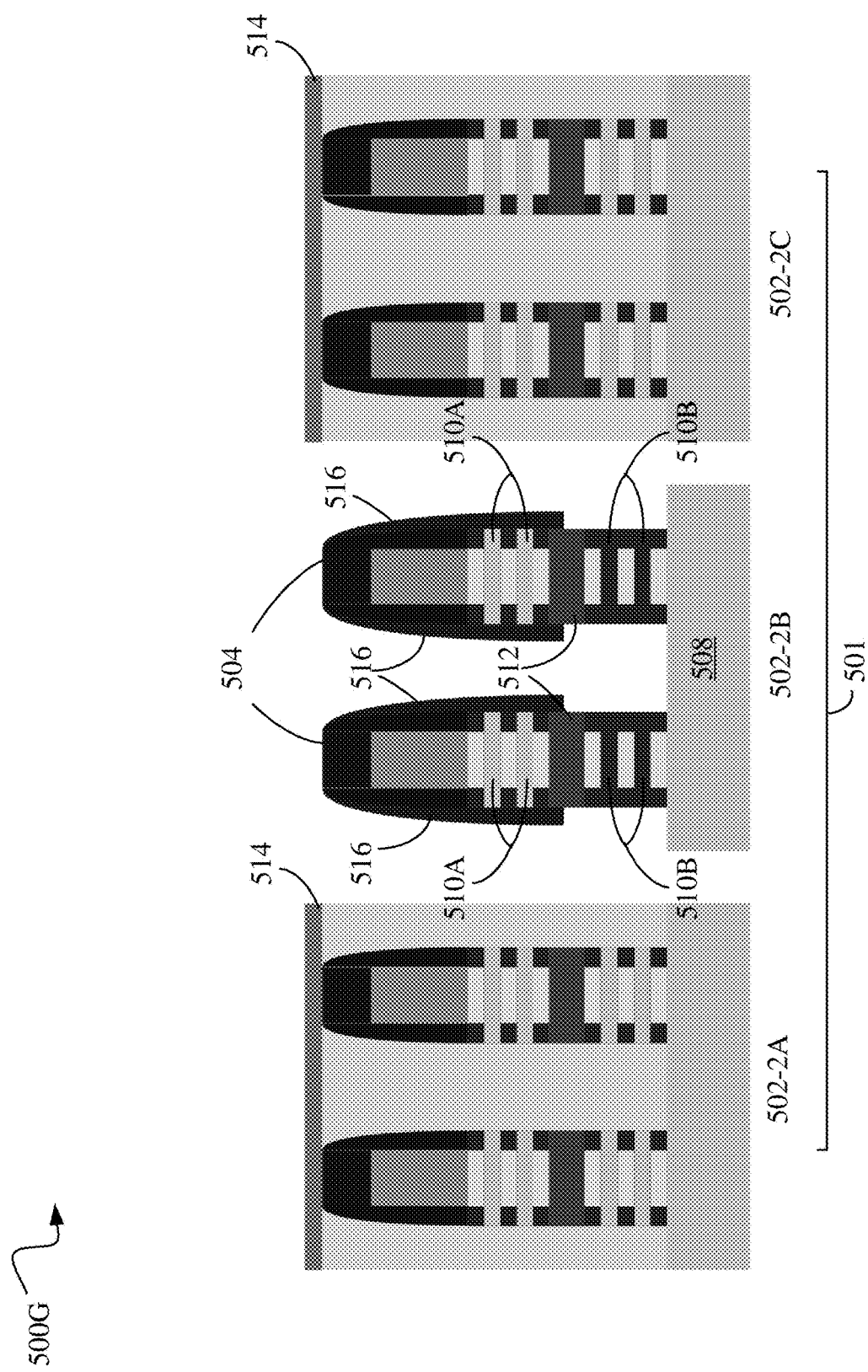
Figure 5H:
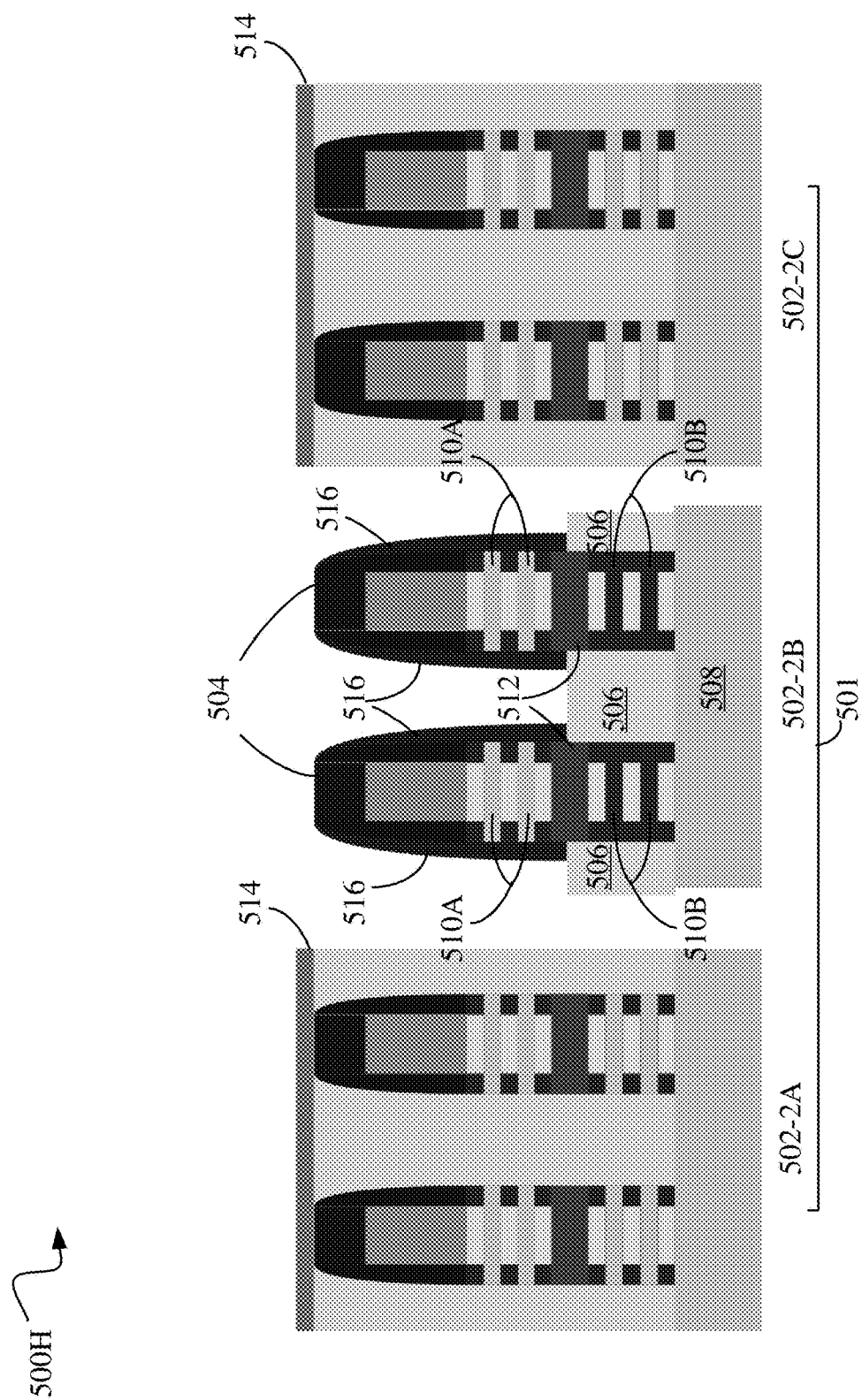
Figure 5I:
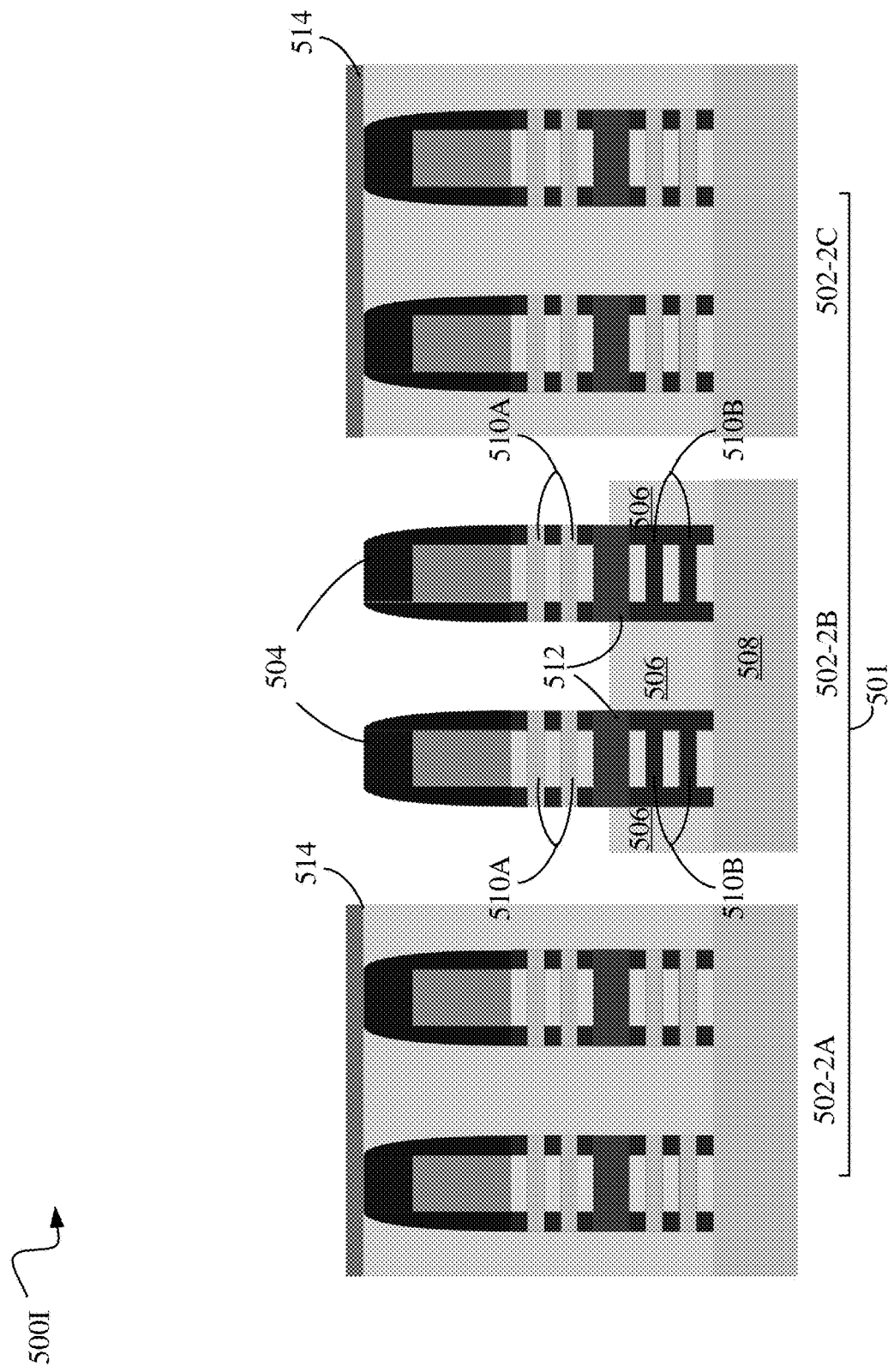
Figure 5J:
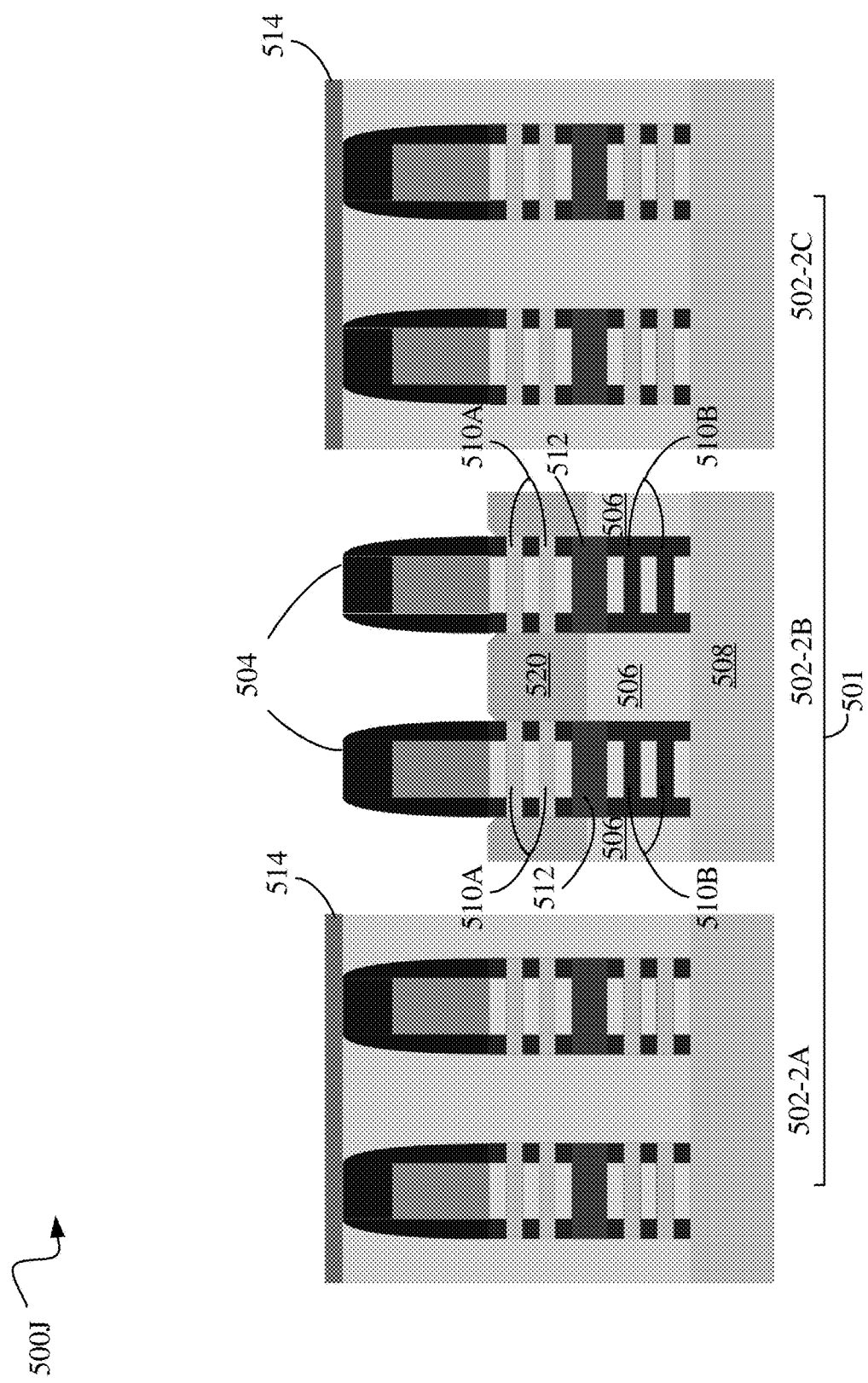
Figure 6:
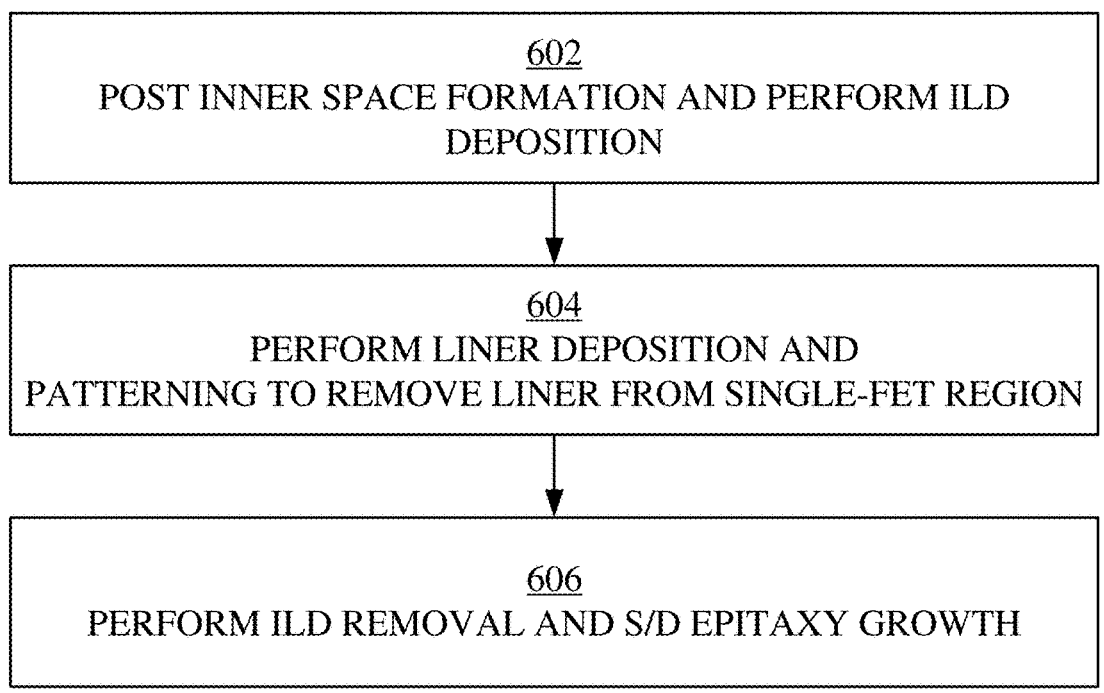
FIG. 6 is a process flow chart of a method for fabricating active gates for unipolar stacked-FET CMOS devices, in accordance with some embodiments of the present disclosure.

Instructions 160 can be processor-executable instructions for performing any portion of, or all, any of the methods described in FIGS. 4 and 6 and/or the functionality discussed in FIGS. 2, 3, 5A-5J, and 7A-7C.

In various embodiments, the I/O devices 112 include an interface capable of presenting information and receiving input. For example, I/O devices 112 can present information to a listener interacting with example stacked-FET CMOS fabrication manager 100 and receive input from the listener.

The example stacked-FET CMOS fabrication manager 100 is connected to the network 150 via the network interface 115. Network 150 can comprise a physical, wireless, cellular, or different network.

In some embodiments, the example stacked-FET CMOS fabrication manager 100 can be a multi-user mainframe computer system, a single-user system, or a server computer or similar device that has little or no direct user interface but receives requests from other computer systems (clients). Further, in some embodiments, the example stacked-FET CMOS fabrication manager 100 can be implemented as a desktop computer, portable computer, laptop or notebook computer, tablet computer, pocket computer, telephone, smart phone, network switches or routers, or any other appropriate type of electronic device.

It is noted that FIG. 1 is intended to depict the representative major components of an example stacked-FET CMOS fabrication manager 100. In some embodiments, however, individual components can have greater or lesser complexity than as represented in FIG. 1, components other than or in addition to those shown in FIG. 1 can be present, and the number, type, and configuration of such components can vary.

Figure 2:
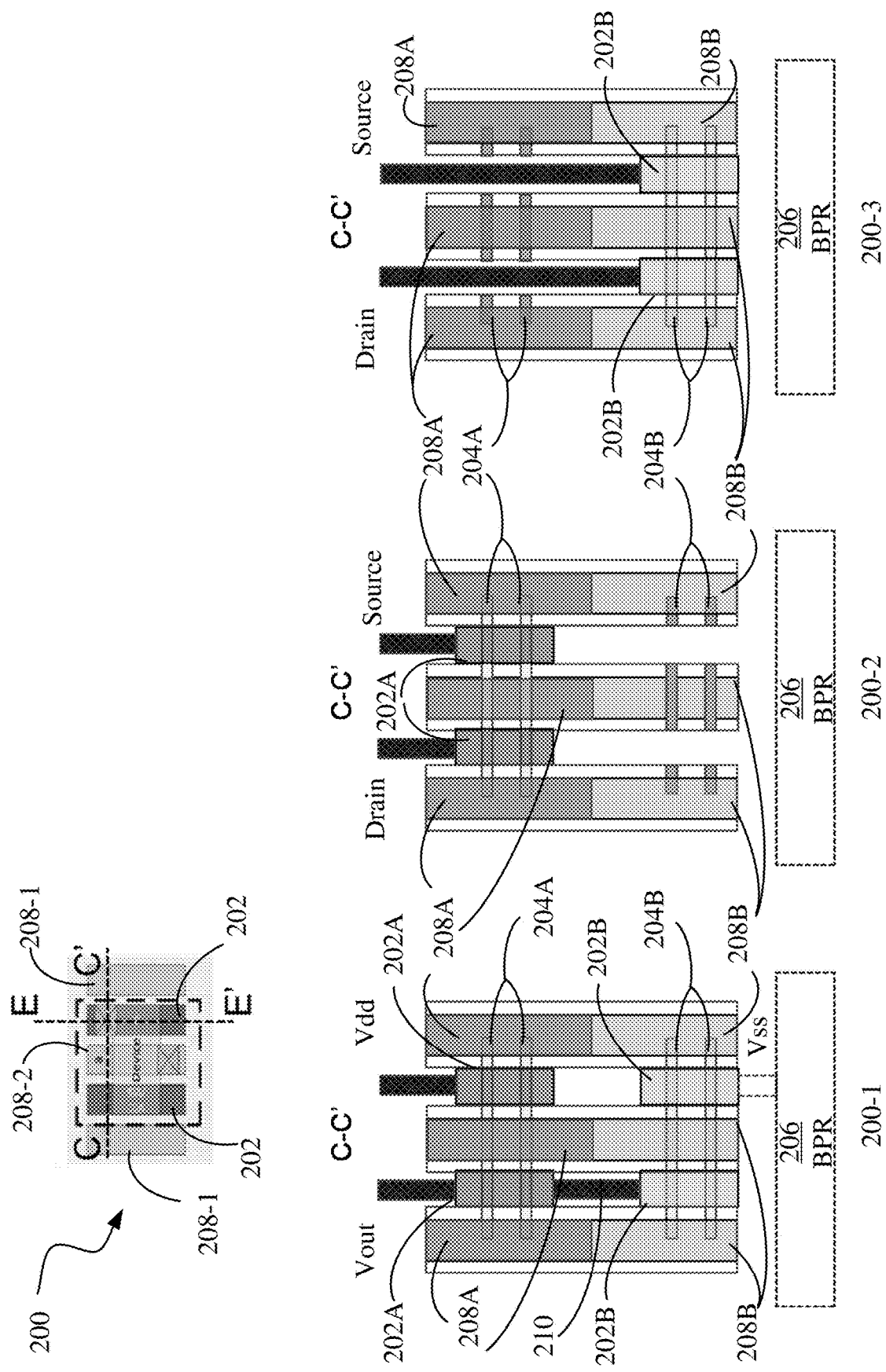
FIG. 2 is a block diagram of the top view of an example stacked-FET CMOS device having unipolar-FET implementation and side views of example stacked-FET CMOS devices, in accordance with some embodiments of the present disclosure.

FIG. 2 is a block diagram of the top view of an example stacked-FET CMOS device 200 having unipolar-FET implementation and side views of example stacked-FET CMOS devices 200-1, 200-2, 200-3, in accordance with some embodiments of the present disclosure. The example stacked-FET CMOS device 200 includes FETs 202, passive gates 208-1, and active gate 208-2 (collectively referred to as gates 208). The FETs 202 have a source and drain, respectively. Accordingly, the active gate 208-2 enables the electric current to pass from the FET 202 having the source to the FET having the drain. The example stacked-FET CMOS device 200 is shown along two-dimensional coordinate axes in the x and y directions (i.e., C to C' and E to E', respectively). The x-axis (i.e., C-C') serves as the respective side views for each of the example stacked-FET CMOS devices 200-1, 200-2, 200-3. Further, each of the example stacked-FET CMOS devices 200-1, 200-2, 200-3 can represent different implementations of the example stacked-FET CMOS device 200.

The example stacked-FET CMOS device 200-1 includes top FETs 202A, bottom FETs 202B, top channels 204A and bottom channels 204B (collectively referred to as channels 204), bottom power rail (BPR) 206, top gates 208A and bottom gates 208B (collectively referred to as gates 208), electrical contact 210, and output voltage (i.e., Vout) and distributed current voltage supply (i.e., Vdd) contacts. The top FETs 202A and bottom FETs 202B can be either of p-type and n-type FETs (e.g., pFETs and nFETs). As shown, the top FET 202A and bottom FET 202B on the left are in electrical contact via the electrical contact 210. In contrast, the top FET 202A and bottom FET 202B on the right are not in electrical contact. Advantageously, this lack of electrical contact may prevent potential issues with the potential electrical capacitance or capacitive coupling.

The channels 204A, 204B of the example CMOS device 200-1 can include nano-sheets, which can be conductive materials that provide relatively high conductivity to connect the source (Vdd) and drain (Vout) in the top FET 202A and bottom FET 202B, respectively. The BPR 206 can provide a ground for the example stacked-FET CMOS device 200-1. However, in some embodiments, the example stacked-FET CMOS device 200-1 may use a different ground. The gates 208 can control electric current flow through the respective top FET 202A and bottom FET 202B.

In contrast to the example stacked-FET CMOS device 200-1, the example stacked-FET CMOS device 200-2 includes top FETs 202A without bottom FETs. The top FETs 202A of the example stacked-FET CMOS device 200-2 can be of the same type (e.g., p-type or n-type). In this way, the example stacked-FET CMOS device 200-2 can provide a unipolar-FET implementation. Similar to the example stacked-FET CMOS device 200-1, the example stacked-FET CMOS device 200-2 includes top channels 204A and bottom channels 204B, BPR 206, top gates 208A and bottom gates 208B, and source and drain contacts. However, in contrast to the example stacked-FET CMOS device 200-1, the bottom channels 204B of example stacked-FET CMOS device 200-2 can include dielectric material instead of nano-sheets. The dielectric material may be silicon nitride (SiN), for example, which may be useful for preventing potential electrical capacitance (which can cause circuit delay) or capacitive coupling (which can cause circuit failure).

In contrast to the example stacked-FET CMOS devices 200-1, 200-2, the example stacked-FET CMOS device 200-3 includes bottom FETs 202B without top FETs. The bottom FETs 202B of the example stacked-FET CMOS device 200-2 can be of the same type (e.g., p-type or n-type). Similar to the example stacked-FET CMOS device 200-1, the example stacked-FET CMOS device 200-3 can include top channels 204A and bottom channels 204B, BPR 206, top gates 208A and bottom gates 208B, and source and drain contacts. Further, in order to prevent potential electrical capacitance or capacitive coupling, the top channels 204A of the stacked-FET CMOS device 200-3 can include dielectric material instead of nano-sheets. In these ways, the example stacked-FET CMOS devices 200-1, 200-2, 200-3 may provide unipolar-FET implementations without introducing the challenges of current single implementation stacked-FET CMOS devices.

FIG. 3 is a block diagram of the top view of an example stacked-FET CMOS device 300 having unipolar-FET implementation and side view of example stacked-FET CMOS device 300-1, in accordance with some embodiments of the present disclosure. The example stacked-FET CMOS device 300 includes gates 308 and FETs 302. The example stacked-FET CMOS device 300 is shown along two-dimensional coordinate axes in the x and y directions (i.e., C to C' and E to E', respectively). The x-axis (i.e., C-C') serves as the side view for the example stacked-FET CMOS device 300-1.

The example stacked-FET CMOS device 300-1 includes top FETs 302A, bottom FETs 302B, top channels 304A and bottom channels 304B (collectively referred to as channels 304), BPR 306, gates 308, electrical contact 310, and drain and source contacts. The top FETs 302A and bottom FETs 302B can be either of p-type and n-type FETs (e.g., pFETs or nFETs, but not both). As shown, the top FETs 302A and bottom FETs 302B are in electrical contact via the electrical contact 310.

The channels 304 of the example CMOS device 300-1 can be similar to the channels 204 described with respect to FIG. 2, and can include nano-sheets. The BPR 306 may be similar to the BPR 206. However, in some embodiments, the example stacked-FET CMOS device 300-1 may use a different ground. The gates 308 may be similar to the gates 208. In this way, the example stacked-FET CMOS device 300-1 can provide a unipolar-FET implementation.

FIG. 4 is a process flow chart of a method 400 for fabricating active gates for unipolar stacked-FET CMOS devices, in accordance with some embodiments of the present disclosure. In some embodiments, an example stacked-FET CMOS fabrication manager, such as the example stacked-FET CMOS fabrication manager 100 described with respect to FIG. 1, can perform the method 400. For clarity, the method 400 is described with respect to FIGS. 5A through 5J.

FIG. 5A is a block diagram of an example fabrication state 500A of a wafer 501 having multiple stacked-FET CMOS devices 503, in accordance with some embodiments of the present disclosure. The wafer 501 may be a silicon wafer for semiconductor devices. The example stacked-FET CMOS device 503 is shown from a top view, and may be similar to the stacked-FET CMOS device 200 described with respect to FIG. 2. The stacked-FET CMOS device 503 includes passive gates 502-1 and active gate 502-2, which are similar to the passive gates 202-1 and active gate 202-2, described with respect to FIG. 2. Accordingly, the wafer 501 may include example active gates 502-2A, 502-2B, 502-2C for each of p-type, and/or n-type FETs in stacked-FET CMOS devices. Some embodiments of the present disclosure can include different combinations of stacked-FET CMOS devices, such as the stacked-FET CMOS devices 200-1, 200-2, 200-3 described with respect to FIG. 2. For clarity, the example active gates 502-2A, 502-2B, 502-2C are also referred herein using the specific combination of CMOS gate 502-2A, pFET gate 502-2B, and nFET gate 502-2C. Additionally, the y-axis (i.e., E-E') serves as the respective side views for each of the example active gates 502-2A, 502-2B, 502-2C.

For further clarity, and because the example active gates 502-2A, 502-2B, 502-2C include the same features, FIGS. 5A through 5J include callout numbers for the pFET gate 502-2B, but not CMOS gate 502-2A and nFET gate 502-2C. Accordingly, the corresponding features in each of the active gates 502-2A, 502-2B, 502-2C are referred to using the same callout numbers. The active gate 502-2B includes pillars 504, ILD 506, and BPR 508. The ILD 506 may be an electrical insulating material, and thus insulate the pillars 504 from each other. The BPR 508 may be similar to the BPR 206 described with respect to FIG. 2.

The pillars 504 can include the features of the active gate 502-2B that control the flow of electricity from one pFET to another pFET. In the cases of the CMOS gate 502-2A and nFET gate 502-2C, the pillars 504 may control the flow of electricity from CMOS to CMOS or nFET to nFET devices. More specifically, the pillars 504 include top channels 510A and bottom channels 510B (collectively referred to as channels 510), which can include electrically conductive nano-sheets. The channels 510 can be similar to the channels 204 described with respect to FIG. 2, and thus may conduct electricity from channels of a pFET on the source side and through channels 510 of the active gate 502-2B to the channels of the pFET on the drain side of the active gate 502-2B. The top channels 510A can conduct electricity between top FETs; and, the bottom channels 510B can conduct electricity between bottom FETs. Additionally, the pillars 504 include dielectric 512, which can isolate the top and bottom FETs.

Referring back to FIG. 4, at operation 402, the example stacked-FET CMOS fabrication manager 100 may direct a fabrication tool to post inner space formation and perform interlayer dielectric deposition (ILD). Posting inner space formation can involve fabricating the pillars 504. Further, performing ILD deposition can involve depositing the ILD 506 as shown on the pillars 504 and BPR 508.

Referring back to FIG. 4, at operation 404, the example stacked-FET CMOS fabrication manager 100 may direct a fabrication tool to perform liner deposition and patterning. Operation 404 is described in greater detail with respect to FIG. 5B, which represents an example fabrication state 500B resulting from the operation 404.

FIG. 5B is a block diagram of an example fabrication state 500B of the wafer 501, in accordance with some embodiments of the present disclosure. The fabrication tool may perform liner deposition by depositing a liner 514 on active gates 502-2A, 502-2B, 502-2C. Additionally, the fabrication tool may perform patterning to remove the liner 514 from the pFET gate 502-2B. Accordingly, in the fabrication state 500B, the CMOS gate 502-2A and nFET gate 502-C include the liner 514, but the pFET gate 502-B does not include the liner 514.

Referring back to FIG. 4, at operation 406, the example stacked-FET CMOS fabrication manager 100 may direct the fabrication tool to perform a partial ILD removal. Operation 406 is described in greater detail with respect to FIG. 5C, which represents an example fabrication state 500B resulting from the operation 406.

FIG. 5C is a block diagram of an example fabrication state 500C of the wafer 501, in accordance with some embodiments of the present disclosure. As shown, performing a partial ILD removal may etch back the ILD 506 to a partial exposure of the dielectric 512. Further, active gates 502-2A, 502-2C do not undergo modification from this or subsequent operations of the method 400 because the liners 514 are not removed from the active gates 502-2A, 502-2C.

Referring back to FIG. 4, at operation 408, the example stacked-FET CMOS fabrication manager 100 may direct the fabrication tool to perform sidewall spacer formation. Operation 408 is described in greater detail with respect to FIG. 5D, which represents an example fabrication state 500D resulting from the operation 408.

FIG. 5D is a block diagram of an example fabrication state 500D of the wafer 501, in accordance with some embodiments of the present disclosure. As shown, performing sidewall spacer formation may include forming sidewall spacers 516 on the pillars 504. The sidewall spacers 516 may protect the pillars 504 from subsequent removal and etching in subsequent operations of the method 400.

Referring back to FIG. 4, at operation 410, the example stacked-FET CMOS fabrication manager 100 may direct the fabrication tool to perform ILD removal. Operation 410 is described in greater detail with respect to FIG. 5E, which represents an example fabrication state 500E resulting from the operation 410.

FIG. 5E is a block diagram of an example fabrication state 500E of the wafer 501, in accordance with some embodiments of the present disclosure. As shown, performing ILD removal can involve removing the remaining ILD 506 from the pFET gate 502-2B.

Referring back to FIG. 4, at operation 412, the example stacked-FET CMOS fabrication manager 100 may direct the fabrication tool to perform a nano-sheet etch. Operation 412 is described in greater detail with respect to FIG. 5F, which represents an example fabrication state 500F resulting from the operation 412.

FIG. 5F is a block diagram of an example fabrication state 500F of the wafer 501, in accordance with some embodiments of the present disclosure. Performing a nano-sheet etch may remove the nano-sheets from the bottom channels 510B, which are exposed. Accordingly, the nano-sheets remain in the top channels 510A.

Referring back to FIG. 4, at operation 414, the example stacked-FET CMOS fabrication manager 100 may direct the fabrication tool to fill the gap with dielectric material. Operation 414 is described in greater detail with respect to FIG. 5G, which represents an example fabrication state 500G resulting from the operation 414.

FIG. 5G is a block diagram of an example fabrication state 500G of the wafer 501, in accordance with some embodiments of the present disclosure. Filling the gap can involve filling the bottom channels 510B with dielectric material. Additionally, operation 414 can involve performing an etch back to remove dielectric material from areas beyond the bottom channels 510B (e.g., on top of the sidewall spacer 516).

Referring back to FIG. 4, at operation 416, the example stacked-FET CMOS fabrication manager 100 may direct the fabrication tool to perform ILD fill and etch back. Operation 416 is described in greater detail with respect to FIG. 5H, which represents an example fabrication state 500H resulting from the operation 416.

FIG. 5H is a block diagram of an example fabrication state 500H of the wafer 501, in accordance with some embodiments of the present disclosure. As shown, performing ILD fill and etch back can involve performing another ILD deposition on the pFET gate 502-2B and etching back ILD (e.g., from the top of the sidewall spacer516).

Referring back to FIG. 4, at operation 418, the example stacked-FET CMOS fabrication manager 100 may direct the fabrication tool to perform sidewall spacer removal. Operation 418 is described in greater detail with respect to FIG. 5I, which represents an example fabrication state 500I resulting from the operation 418.

FIG. 5I is a block diagram of an example fabrication state 500I of the wafer 501, in accordance with some embodiments of the present disclosure. As shown, performing sidewall spacer removal involves removing the sidewall spacers 516 shown in FIG. 5H from the pillars 504.

Referring back to FIG. 4, at operation 420, the example stacked-FET CMOS fabrication manager 100 may direct the fabrication tool to perform source/drain (S/D) epitaxy (EPI) formation. Operation 420 is described in greater detail with respect to FIG. 5J, which represents an example fabrication state 500J resulting from the operation 420.

FIG. 5J is a block diagram of an example fabrication state 500J of the wafer 501, in accordance with some embodiments of the present disclosure. As shown, performing S/D EPI formation involves growing an S/D epitaxy 520 around the pillars 504, specifically with respect to the top channels 510A.

In this way, some embodiments of the present disclosure may thus provide unipolar-FET implementation in stacked-FET CMOS devices 503. While this example describes fabrication with respect to a top pFET gate 502-2B, some embodiments of the present disclosure may provide similar fabrication with respect to a bottom pFET gate, upper nFET gate, and/or lower nFET gate.

FIG. 6 is a process flow chart of a method 600 for fabricating active gates for unipolar stacked-FET CMOS devices, in accordance with some embodiments of the present disclosure. In some embodiments, an example stacked-FET CMOS fabrication manager, such as the example stacked-FET CMOS fabrication manager 100 described with respect to FIG. 1, can perform the method 600. For clarity, the method 600 is described with respect to FIGS. 7A through 7C.

Figure 7A:
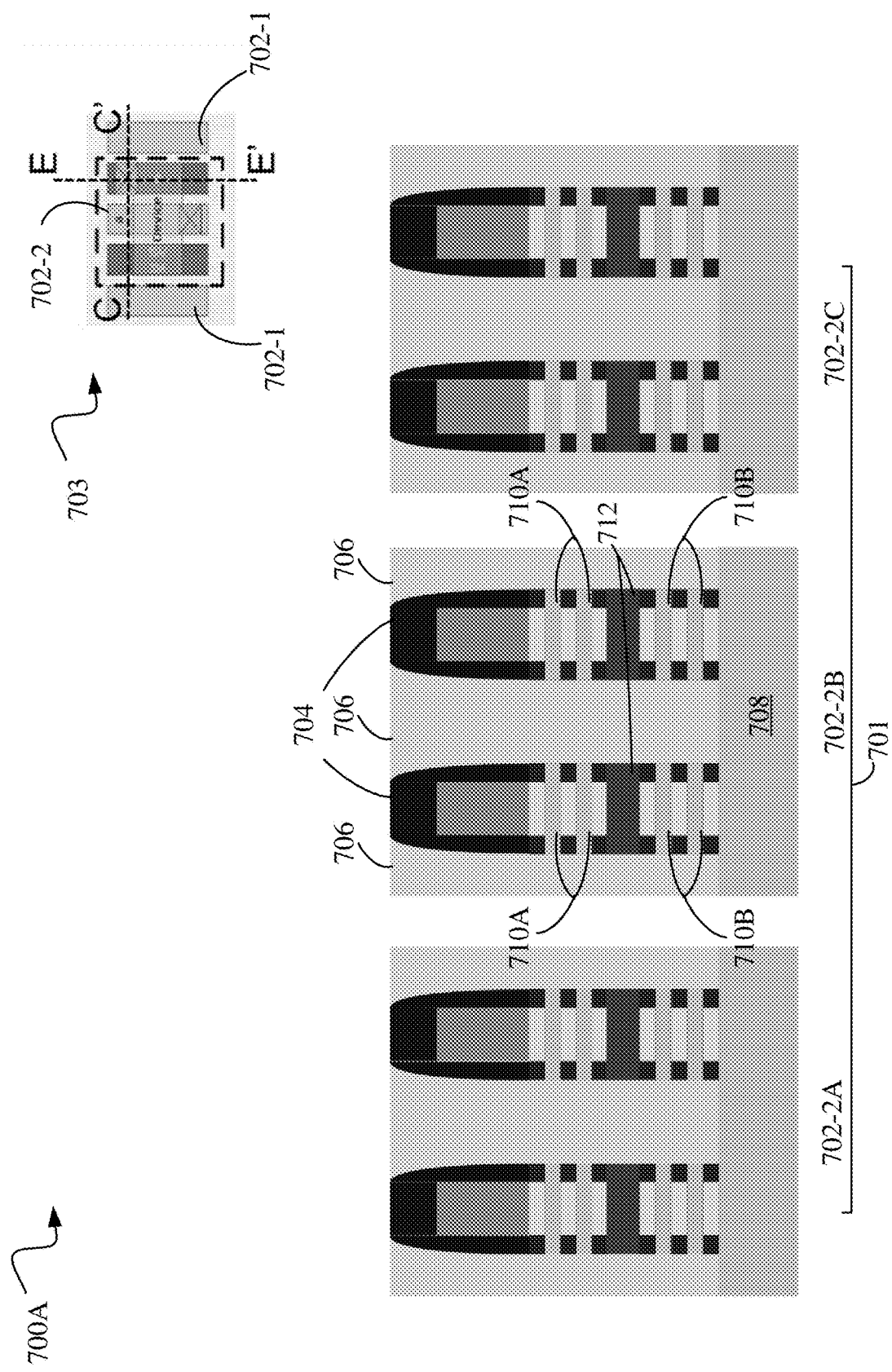
FIGS. 7A, 7B, and 7C are block diagrams of example fabrication states of a wafer having multiple stacked-FET CMOS devices, in accordance with some embodiments of the present disclosure.

FIG. 7A is a block diagram of an example fabrication state 700A of a wafer 701 having multiple stacked-FET CMOS devices 703, in accordance with some embodiments of the present disclosure. The wafer 701 may be similar to the wafer 501 described with respect to FIG. 5. The stacked-FET CMOS device 703 includes passive gates 702-1 and active gate 702-2, which are similar to the passive gates 302-1 and active gate 302-2, described with respect to FIG. 3. Accordingly, the wafer 701 may include example active gates 702-2A, 702-2B, 702-2C for each of p-type, and/or n-type FETs in stacked-FET CMOS devices. Some embodiments of the present disclosure can include different combinations of stacked-FET CMOS devices, such as the stacked-FET CMOS device 300-1 described with respect to FIG. 3. For clarity, the example active gates 702-2A, 702-2B, 702-2C are also referred herein using the specific combination of CMOS gate 702-2A, pFET gate 702-2B, and nFET gate 702-2C. Additionally, the y-axis (i.e., E-E') serves as the respective side views for each of the example active gates 702-2A, 702-2B, 702-2C.

Figure 7B:
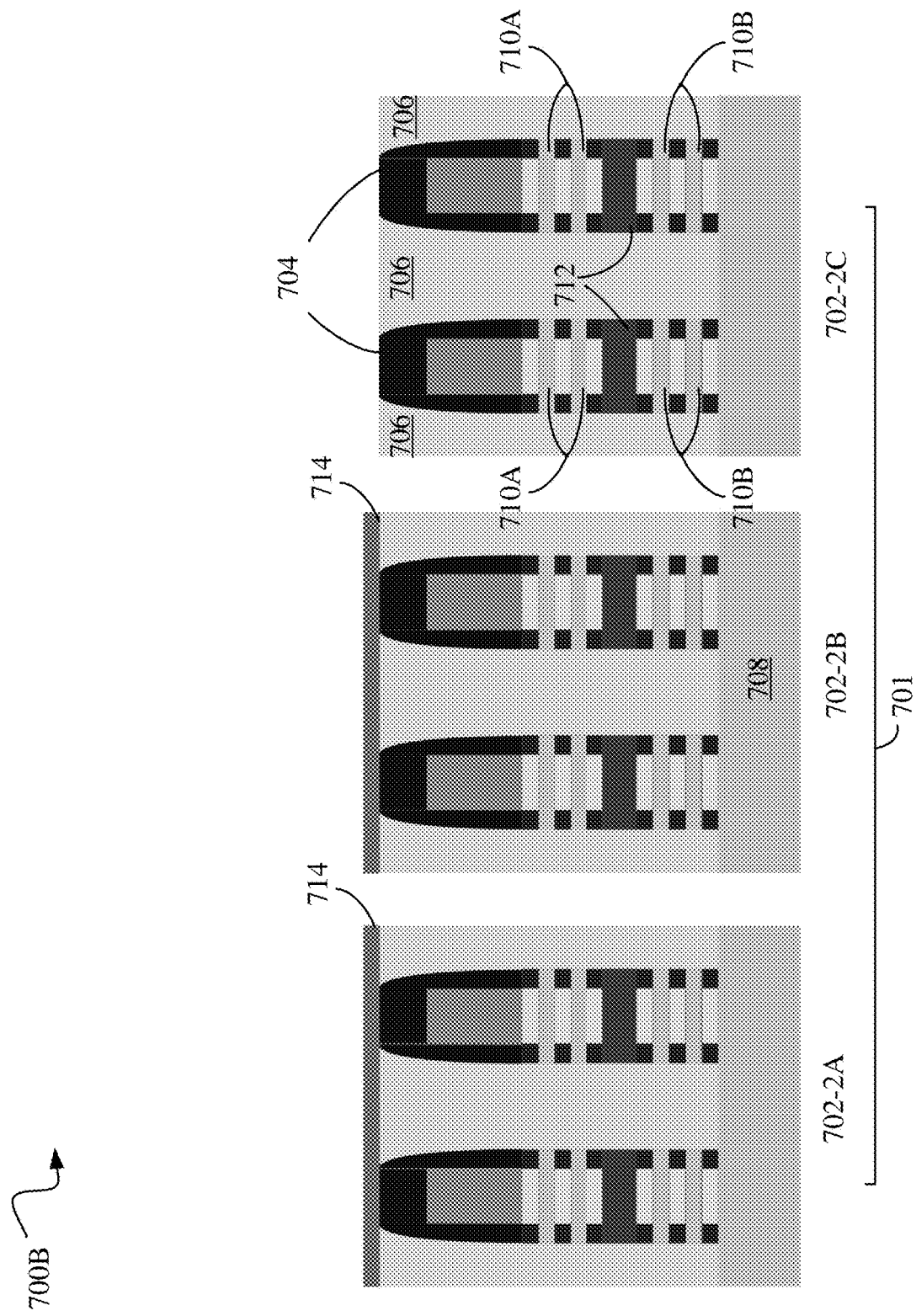
Figure 7C:
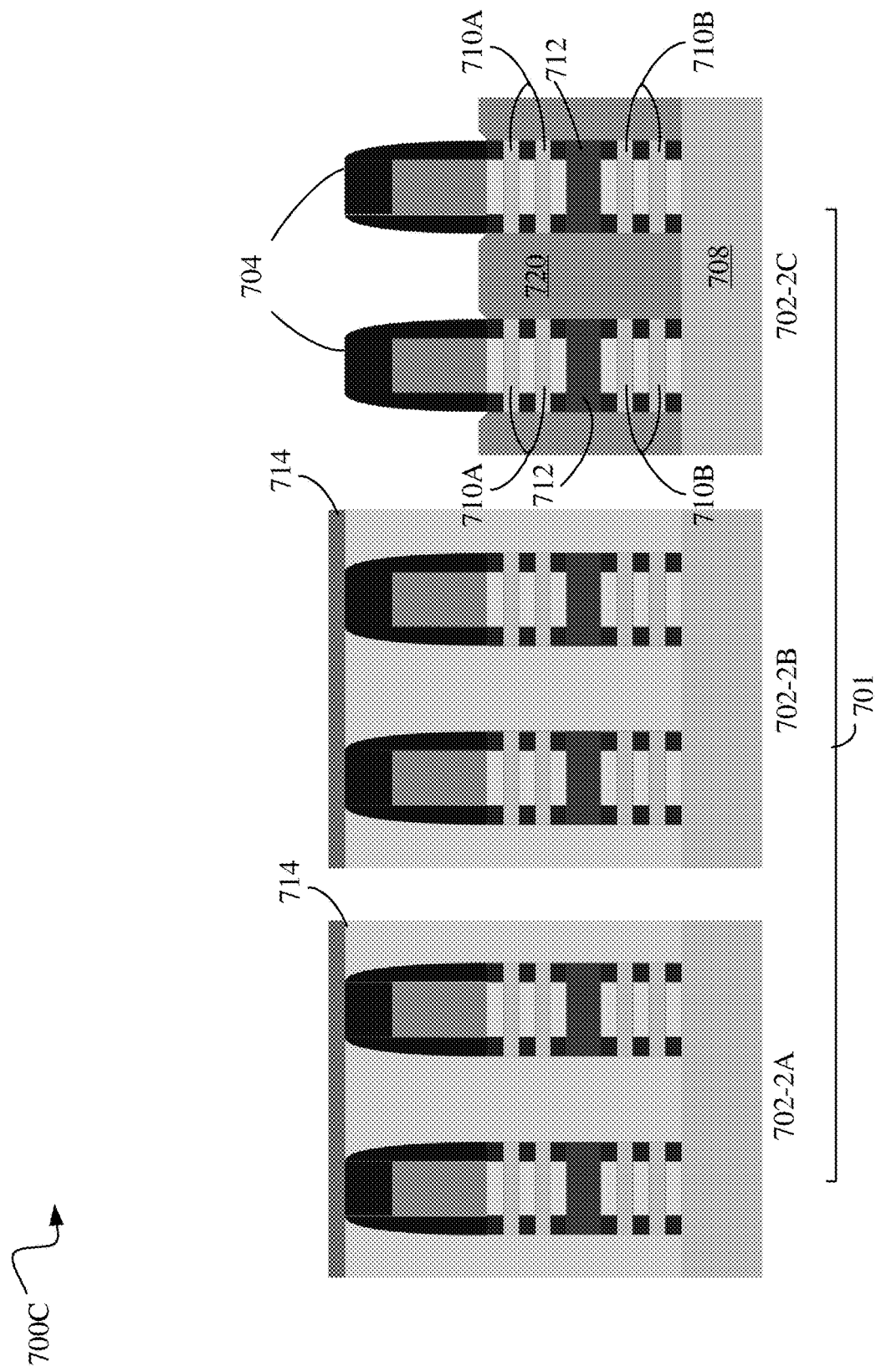

For clarity, and because the example active gates 702-2A, 702-2B, 702-2C include the same features, FIGS. 7A through 7C include callout numbers for the pFET gate 702-2C, but not CMOS gate 702-2A and nFET gate 702-2B. Accordingly, the corresponding features in each of the active gates 702-2A, 702-2B, 702-2C are referred to using the same callout numbers. The active gate 702-2C includes pillars 704, ILD 706, and BPR 708, which may be similar to the pillars 504, ILD 506, and BPR 508 described with respect to FIG. 5. Further, the fabrication state 700A may result from the operation 602.

Referring back to FIG. 6, at operation 602, the example stacked-FET CMOS fabrication manager 100 may direct a fabrication tool to post inner space formation and perform interlayer dielectric deposition (ILD). Posting inner space formation can involve fabricating the pillars 704. Further, performing ILD deposition can involve depositing the ILD 706 as shown on the pillars 704 and BPR 708.

Referring back to FIG. 6, at operation 604, the example stacked-FET CMOS fabrication manager 100 may direct a fabrication tool to perform liner deposition and patterning. Operation 604 is described in greater detail with respect to FIG. 7B, which represents an example fabrication state 700B resulting from the operation 604.

FIG. 7B is a block diagram of an example fabrication state 700B of the wafer 701, in accordance with some embodiments of the present disclosure. The fabrication tool may perform liner deposition by depositing a liner 714 on active gates 702-2A, 702-2B, 702-2C. Additionally, the fabrication tool may perform patterning to remove the liner 714 from the pFET gate 702-2C. Accordingly, in the fabrication state 700B, the CMOS gate 702-2A and nFET gate 702-C include the liner 714, but the pFET gate 702-C does not include the liner 714.

Referring back to FIG. 6, at operation 606, the example stacked-FET CMOS fabrication manager 100 may direct the fabrication tool to perform ILD removal and S/D epitaxy (EPI) growth. Operation 606 is described in greater detail with respect to FIG. 7C, which represents an example fabrication state 700C resulting from the operation 606.

FIG. 7C is a block diagram of an example fabrication state 700C of the wafer 701, in accordance with some embodiments of the present disclosure. As shown, performing ILD removal and S/D epitaxy growth involves removing the ILD 706 and growing an S/D epitaxy 720 around the pillars 704, specifically with respect to the top channels 710A.

In this way, some embodiments of the present disclosure may thus provide unipolar-FET implementation in stacked-FET CMOS devices 703. While this example describes fabrication with respect to an nFET gate, some embodiments of the present disclosure may provide similar fabrication with respect to a pFET gate.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system comprising:
    a first unipolar stacked field effect transistor complementary metal oxide semiconductor (stacked-FET CMOS) comprising:
        a first FET comprising a plurality of first channels each comprising a nano-sheet in electrical contact with a corresponding nano-sheet in a corresponding plurality of first channels for an active gate, wherein the first FET is disposed in a first stack position of the first unipolar stacked-FET CMOS; and
        the active gate comprising:
            the corresponding plurality of first channels; and
            a corresponding plurality of second channels comprising a dielectric material,
    the system further comprising a wafer, comprising:
    the first unipolar stacked-FET CMOS;
    a second unipolar stacked-FET CMOS; and
    a stacked-FET CMOS,
    wherein the stacked-FET CMOS comprises:
        a first FET CMOS comprising a plurality of first CMOS channels each comprising a CMOS nano-sheet in electrical contact with a corresponding CMOS nano-sheet in a corresponding plurality of first CMOS channels for a CMOS active gate, wherein the first FET CMOS is disposed in a top FET position of the stacked-FET CMOS, and wherein the first FET CMOS is of a first type;
        a second FET CMOS comprising a plurality of second CMOS channels each comprising the CMOS nano-sheet in electrical contact with the corresponding CMOS nano-sheet in a corresponding plurality of second CMOS channels for the CMOS active gate, wherein the second FET CMOS is disposed in a bottom FET position of the stacked-FET CMOS, and wherein the second FET CMOS is of the first type, and wherein the first FET CMOS and the second FET CMOS are in electrical contact with each other;
        the CMOS active gate comprising:
            the corresponding plurality of first CMOS channels; and
            the corresponding plurality of second CMOS channels.

2. The system of claim 1, wherein the first stack position is selected from a group consisting of a top FET position and a bottom FET position.

3. The system of claim 1, further comprising a second FET comprising a second plurality of channels each comprising a second nano-sheet in electrical contact with the corresponding nano-sheet in the corresponding plurality of first channels for the active gate, wherein the second FET is disposed on an opposite side of the active gate from the first FET.

4. The system of claim 3, wherein the first FET comprises a drain contact, and wherein the second FET comprises a source contact.

5. The system of claim 1, further comprising a passive gate, wherein the passive gate is disposed on an opposite side of the first FET from the active gate, and wherein the passive gate comprises a passive plurality of channels, each comprising a passive nano-sheet in electrical contact with one of the plurality of first channels.

6. The system of claim 1, further comprising a buried power rail that provides an electrical ground for the first unipolar stacked-FET CMOS.

7. The system of claim 1, wherein the first FET comprises a p-type FET (pFET), and wherein the second unipolar stacked-FET CMOS comprises a second FET comprising an n-type FET (nFET).

8. A system comprising:
a unipolar stacked field effect transistor complementary metal oxide semiconductor (stacked-FET CMOS) comprising:
   a first FET comprising a plurality of first channels each comprising a nano-sheet in electrical contact with a corresponding nano-sheet in a corresponding plurality of first channels for an active gate, wherein the first FET is disposed in a top FET position of the unipolar stacked-FET CMOS, and wherein the first FET is of a first type;
   a second FET comprising a plurality of second channels each comprising the nano-sheet in electrical contact with the corresponding nano-sheet in a corresponding plurality of second channels for the active gate, wherein the second FET is disposed in a bottom FET position of the unipolar stacked-FET CMOS, and wherein the second FET is of the first type, and wherein the first FET and the second FET are in electrical contact with each other;
   the active gate comprising:
      the corresponding plurality of first channels; and
      the corresponding plurality of second channels,
the system further comprising:
   a third FET comprising a plurality of third channels each comprising the nano-sheet in electrical contact with the corresponding nano-sheet in the corresponding plurality of first channels for the active gate, wherein the third FET is disposed in the top FET position of the unipolar stacked-FET CMOS, and wherein the third FET is of the first type; and
   a fourth FET comprising a plurality of fourth channels each comprising the nano-sheet in electrical contact with the corresponding nano-sheet in the corresponding plurality of second channels for the active gate, wherein the fourth FET is disposed in the bottom FET position of the unipolar stacked-FET CMOS, and wherein the fourth FET is of the first type, and wherein the third FET and the fourth FET are in electrical contact with each other.

9. The system of claim 8, further comprising a wafer, comprising:
   the unipolar stacked-FET CMOS; and
   a stacked-FET CMOS.

10. The system of claim 8, wherein a type of the first FET, second FET, third FET, and fourth FET is selected from a group consisting of a p-type FET (pFET) and an n-type FET (nFET).

11. A semiconductor structure comprising:
a unipolar stacked field effect transistor comprising:
   a first metal gate surrounding a first plurality of nanosheets and horizontally between a first set of a first and a second source/drain region;
   a second metal gate surrounding a second plurality of nanosheets and horizontally between a second set of a first and a second source/drain region; and
   the first metal gate and the second metal gate are vertically stacked together,
   wherein either the first metal gate is an active gate and the second metal gate is an inactive gate with the first plurality of nanosheets comprising silicon-containing material and the second plurality of nanosheets comprising dielectric material, or the first and the second metal gate are both active metal gates and the first and second source/drain regions of the first set surrounding the first metal gate are respectively connected with the first and second source/drain regions of the second set surround the second metal gate.

* * * * *